(12) United States Patent
Zhang et al.

(10) Patent No.: US 12,392,854 B2
(45) Date of Patent: Aug. 19, 2025

(54) MAGNETIC RESONANCE IMAGE PROCESSING METHOD AND DEVICE, AND COMPUTER READABLE STORAGE MEDIUM

(71) Applicant: GE Precision Healthcare LLC, Wauwatosa, WI (US)

(72) Inventors: Hanbei Zhang, Beijing (CN); Yongchuan Lai, Beijing (CN); Pengfei Lu, Beijing (CN); Zhao Wang, Beijing (CN); Pengshuai Wang, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 17/540,104

(22) Filed: Dec. 1, 2021

(65) Prior Publication Data

US 2022/0206097 A1    Jun. 30, 2022

(30) Foreign Application Priority Data

Dec. 30, 2020   (CN) .......................... 202011613176.6

(51) Int. Cl.
*G01R 33/565* (2006.01)
*G01R 33/24* (2006.01)
*G01R 33/34* (2006.01)
*G01R 33/54* (2006.01)
*G01R 33/56* (2006.01)

(52) U.S. Cl.
CPC ....... *G01R 33/5659* (2013.01); *G01R 33/246* (2013.01); *G01R 33/34092* (2013.01); *G01R 33/543* (2013.01); *G01R 33/5608* (2013.01)

(58) Field of Classification Search
CPC .......... G01R 33/5659; G01R 33/34092; G01R 33/543; G01R 33/5608; G01R 33/56; G01R 33/246
See application file for complete search history.

(56) References Cited

U.S. PATENT DOCUMENTS

| | | |
|---|---|---|
| 8,217,652 B2 | 7/2012 | Dannels |
| 9,291,691 B2 | 3/2016 | Amadon |
| 10,175,329 B2 | 1/2019 | Kachi |
| 10,247,802 B2 | 4/2019 | Wang |
| 2007/0210794 A1* | 9/2007 | Kabasawa ............ G01R 33/583 324/309 |
| 2016/0018502 A1* | 1/2016 | Wang ................. G01R 33/5659 600/416 |

(Continued)

FOREIGN PATENT DOCUMENTS

WO    WO-2016109234 A1 *    7/2016    ........... G01R 33/246

*Primary Examiner* — Rishi R Patel (57) ABSTRACT

Provided in embodiments of the present invention are a magnetic resonance image processing method and device, and a computer-readable storage medium. The method includes: determining a central angle; converting, on the basis of the central angle, a radio-frequency field pattern of a radio-frequency transmitting coil into an angular pattern; acquiring, on the basis of a trigonometric function value of the angular pattern, a radio-frequency transmitting field pattern of the radio-frequency transmitting coil; and correcting, on the basis of the radio-frequency transmitting field pattern, a magnetic resonance image to be corrected.

6 Claims, 4 Drawing Sheets

(56) References Cited

U.S. PATENT DOCUMENTS

| | | | | |
|---|---|---|---|---|
| 2016/0146908 A1* | 5/2016 | Köhler | ............... | G01R 33/5659 |
| | | | | 382/131 |
| 2016/0291107 A1* | 10/2016 | Rosen | ................... | G01R 33/543 |
| 2018/0120399 A1* | 5/2018 | Lai | ........................ | G01R 33/36 |

* cited by examiner

MAGNETIC RESONANCE IMAGE PROCESSING METHOD AND DEVICE, AND COMPUTER READABLE STORAGE MEDIUM

TECHNICAL FIELD

The present invention relates to the field of medical imaging, in particular to a magnetic resonance image processing method and device.

BACKGROUND

In current magnetic resonance imaging technology, before an imaging scan is conducted on a patient, a radio-frequency receiving field pattern of a surface coil is acquired through a correction scan (pre-scan). The radio-frequency receiving field pattern of the surface coil is used to enhance image uniformity, in order to acquire a more uniform image after the imaging scan. In general, it is considered that a radio-frequency field pattern of a transmitting coil (such as a body coil) is uniformly distributed. Therefore, in the pre-scan, a body coil image and a surface coil image can be obtained separately, and the radio-frequency receiving field pattern of the surface coil is obtained according to the body coil image, the surface coil image, and the radio-frequency field pattern of the body coil.

With the rapid development of magnetic resonance imaging technology, the body coil used in a magnetic resonance imaging system may have nonuniform sensitivity due to changes in size thereof or other parameters, which also results in the problem of nonuniform image. In order to further enhance the image uniformity, those skilled in the art propose correcting an image by using the radio-frequency field pattern of the body coil.

Although the uniformity of the image can be improved based on such correction, there will still be some shadows in the image, and the uniformity still needs to be improved.

Therefore, it is necessary to provide a novel magnetic resonance image processing method and device that can acquire a magnetic resonance image with enhanced uniformity.

BRIEF DESCRIPTION

Provided in one aspect of the present invention is a magnetic resonance image processing method, comprising:
  determining a central angle;
  converting, on the basis of the central angle, a radio-frequency field pattern of a radio-frequency transmitting coil into an angular pattern;
  acquiring, on the basis of a trigonometric function value of the angular pattern, a radio-frequency transmitting field pattern of the radio-frequency transmitting coil; and
  correcting, on the basis of the radio-frequency transmitting field pattern, a magnetic resonance image to be corrected.

In another aspect, the step of acquiring a radio-frequency transmitting field pattern of the radio-frequency transmitting coil further comprises: determining a weight parameter, and adjusting, on the basis of the weight parameter, the trigonometric function value of the angular pattern, wherein the radio-frequency transmitting field pattern is acquired on the basis of the adjusted trigonometric function value.

In another aspect, the radio-frequency transmitting field pattern is acquired on the basis of a formula $$f_{psd}(B1_B^+)' = \sum C_n (f(\theta))^n, \text{ where } f_{psd}(B1_B^+)'$$

is the radio-frequency transmitting field pattern, $C_n$ is the weight parameter, $C_n$ is greater than 0, n is greater than 0, $\theta$ is an angle value in the angular pattern, and $f(\theta)$ is a trigonometric function with $\theta$ as an independent variable.

In another aspect, the trigonometric function value of the angular pattern comprises a sine function value of the angular pattern.

In another aspect, the central angle is determined on the basis of a flip angle of a radio-frequency transmitting pulse of a scan sequence that generates the magnetic resonance image.

In another aspect, the method further comprises: dividing the corrected magnetic resonance image by the radio-frequency field pattern of the radio-frequency transmitting coil to obtain a further corrected image.

In another aspect, the magnetic resonance image to be corrected is an image obtained after image correction is performed on the basis of the radio-frequency field pattern of the radio-frequency transmitting coil.

In another aspect, the central angle is 90 degrees.

Further provided in another aspect of the present invention is a magnetic resonance image processing device, comprising:
  an angle determination module, configured to determine a central angle;
  a conversion module, configured to convert, on the basis of the central angle, a radio-frequency field pattern of a radio-frequency transmitting coil into an angular pattern;
  a radio-frequency transmitting field pattern acquisition module, configured to acquire, on the basis of a trigonometric function value of the angular pattern, a radio-frequency transmitting field pattern of the radio-frequency transmitting coil; and
  a correction module, configured to correct, on the basis of the radio-frequency transmitting field pattern, a magnetic resonance image to be corrected.

In another aspect, the radio-frequency transmitting field pattern acquisition module is configured to:
  determine a weight parameter, and adjust the trigonometric function value of the angular pattern on the basis of the weight parameter; and
  acquire, on the basis of the adjusted trigonometric function value, the radio-frequency transmitting field pattern.

In another aspect, the radio-frequency transmitting field pattern acquisition module is configured to acquire the radio-frequency transmitting field pattern on the basis of a formula $$f_{psd}(B1_B^+)' = \sum C_n (f(\theta))^n, \text{ where } f_{psd}(B1_B^+)'$$

is the radio-frequency transmitting field pattern, $C_n$ is the weight parameter, $C_n$ is greater than 0, n is greater than 0, $\theta$ is an angle value in the angular pattern, and $f(\theta)$ is a trigonometric function with $\theta$ as an independent variable.

Other features and aspects will become clear through the following detailed description, accompanying drawings, and claims.

BRIEF DESCRIPTION OF THE DRAWINGS

The present invention may be better understood by means of the description of exemplary embodiments of the present invention with reference to accompanying drawings, in which.

DETAILED DESCRIPTION

Specific implementations of the present invention will be described in the following. It should be noted that during the specific description of the implementations, it is impossible to describe all features of the actual implementations in detail in this description for the sake of brief description. It should be understood that in the actual implementation of any of the implementations, as in the process of any engineering project or design project, a variety of specific decisions are often made in order to achieve the developer's specific objectives and meet system-related or business-related restrictions, which will vary from one implementation to another. Moreover, it can also be understood that although the efforts made in such development process may be complex and lengthy, for those of ordinary skill in the art related to content disclosed in the present invention, some changes in design, manufacturing, production or the like based on the technical content disclosed in the present disclosure are only conventional technical means, and should not be construed as that the content of the present disclosure is insufficient.

Unless otherwise defined, the technical or scientific terms used in the claims and the description are as they are usually understood by those of ordinary skill in the art to which the present invention pertains. The terms "first," "second," and similar terms used in the description and claims of the patent application of the present invention do not denote any order, quantity, or importance, but are merely intended to distinguish between different constituents. "One," "a(n)," and similar terms are not meant to be limiting, but rather denote the presence of at least one. The term "include," "comprise," or a similar term is intended to mean that an element or article that appears before "include" or "comprise" encompasses an element or article and equivalent elements that are listed after "include" or "comprise," and does not exclude other elements or articles. The term "connect," "connected," or a similar term is not limited to a physical or mechanical connection, and is not limited to a direct or indirect connection.

The magnetic resonance image uniformity correction method in an embodiment of the present invention can be used in a magnetic resonance imaging apparatus to acquire a magnetic resonance image of a part to be tested of a patient. Those skilled in the art should understand that the magnetic resonance imaging apparatus may include a main magnet for generating a main magnetic field, a radio-frequency system for generating a radio-frequency field, and a gradient system for generating a gradient field. The radio-frequency system may include a body coil and a receiving coil, the body coil may be used as a radio-frequency transmitting coil and/or a radio-frequency receiving coil, and the surface coil may be used as a radio-frequency receiving coil. The magnetic resonance imaging apparatus may further include a computer system, which can control a pulse generator to generate a radio-frequency pulse, a gradient pulse, etc., to control the radio-frequency system and the gradient system to emit a signal acting on a human body, so as to eventually receive a magnetic resonance signal from the human body for use in image reconstruction.

Figure 1:
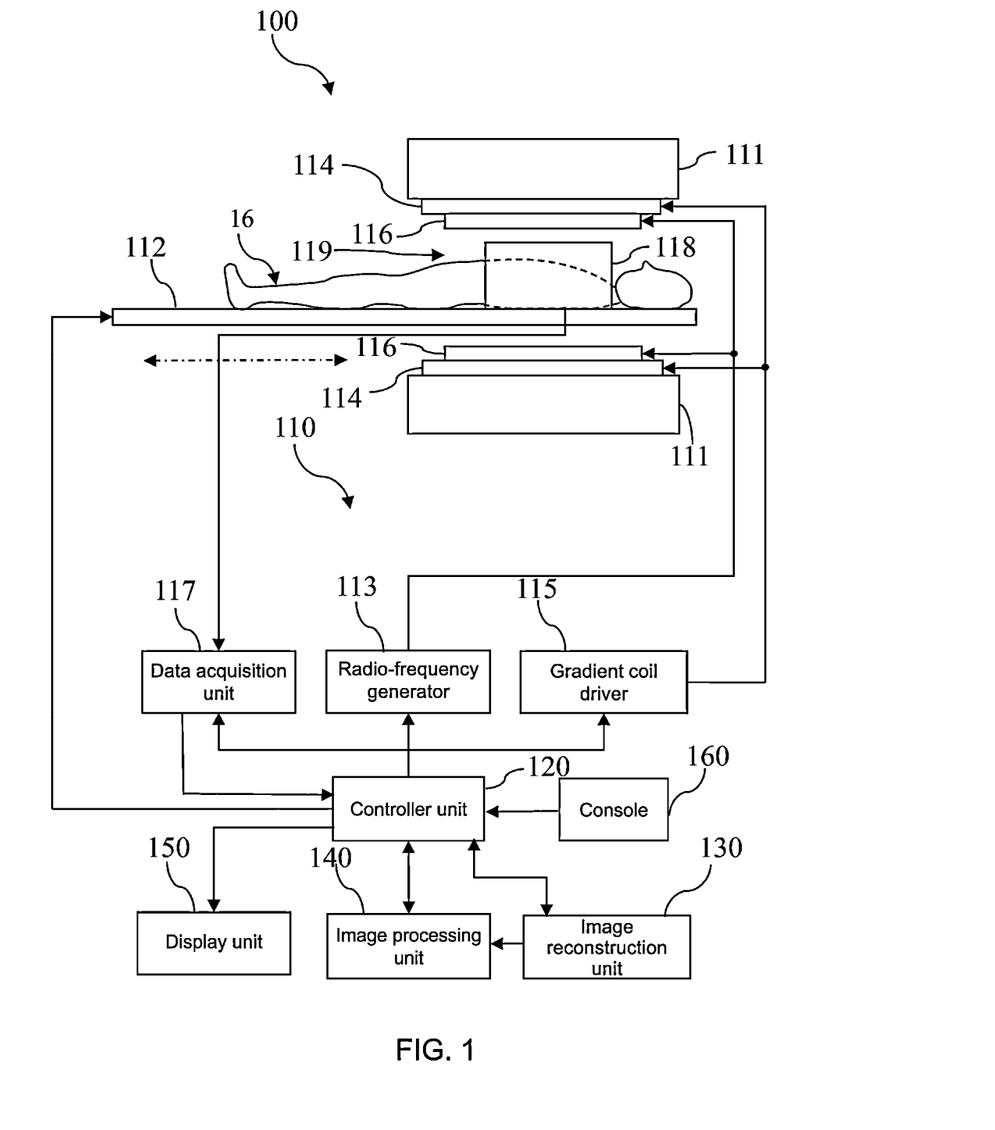
FIG. 1 is a schematic structural diagram of one embodiment of a magnetic resonance imaging system.

FIG. 1 is a schematic structural diagram of a magnetic resonance imaging (MM) system. The magnetic resonance imaging system 100 includes a scanner 110. The scanner 110 is configured to perform magnetic resonance scanning on an object (for example, a human body) 16 to produce image data of a region of interest of the object 16, and the region of interest may be a predetermined imaging part or tissue of the object to be imaged.

The magnetic resonance imaging system 100 may include a controller 120 coupled to the scanner 110 so as to control the scanner 110 to perform the aforementioned magnetic resonance scanning process. Specifically, the controller 120 may send a sequence control signal to relevant components (such as a radio-frequency generator and a gradient coil driver that will be described below) of the scanner 110 by means of a sequence generator (not shown in the drawing), so that the scanner 110 performs a preset scan sequence.

Those skilled in the art could understand that the "scan sequence" refers to a combination of pulses having specific amplitudes, widths, directions, and time sequences and applied when a magnetic resonance imaging scan is performed. The pulses may typically include, for example, a radio-frequency pulse and a gradient pulse. The radio-frequency pulse may include, for example, a radio-frequency transmit pulse, a radio-frequency refocusing pulse, etc., that are used to excite protons in the human body to resonate. The gradient pulse may include, for example, a layer selection gradient pulse, a phase encoding gradient pulse, a frequency encoding gradient pulse, etc. Typically, a plurality of scan sequences may be pre-configured in a magnetic resonance system, so that a sequence corresponding to clinical test requirements is selectable. The clinical test requirements may include, for example, a part to be imaged, an imaging function, an imaging effect, etc.

In practice, it may be required to select different scan sequence types based on different clinical applications, for example, an echo planar imaging (EPI) sequence, a gradient echo (GRE) sequence, a spin echo (SE) sequence, a fast spin echo (FSE) sequence, a single-shot fast spin echo (SSFSE), a diffusion weighted imaging (DWI) sequence, an inversion recovery (IR) sequence, etc. Each scan sequence may have different scan sequence parameters in different clinical applications, for example, the number of excitations (Nex), the time of echo, the echo train length, the repetition time, the inversion recovery time, etc.

The number of excitations refers to the number of excitations performed on the same tissue, and for example, the number of times that the radio-frequency transmit pulse is applied.

In an example, the scanner 110 may include a main magnet assembly 111, a table 112, a radio-frequency generator 113, a radio-frequency transmitting coil 114, a surface coil 118, a gradient coil driver 115, a gradient coil assembly 116, and a data acquisition unit 117.

The main magnet assembly 111 usually includes an annular superconducting magnet defined in a housing. The annular superconducting magnet is mounted in an annular vacuum container. The annular superconducting magnet and the housing thereof define a cylindrical space surrounding the object 16, such as a scanning chamber 119 shown in FIG. 1. The main magnet assembly 111 generates a constant magnetic field, i.e., a B0 field, in a Z direction of the scanning chamber 119. Typically, a uniform portion of the B0 field is formed in a central region of the main magnet.

The table 112 is configured to carry the object 16, and travel in the Z direction to enter or exit the aforementioned scanning chamber 119 in response to the control of the controller 120. For example, in one embodiment, an imaging volume of the object 16 may be positioned in a central region of the scanning chamber with uniform magnetic field strength so as to facilitate scanning imaging of the imaging volume of the object 16.

The Z direction is typically the direction extending from the head to the feet (or from the feet to the head) when the object 16 is positioned on the table 112. For example, a selected layer may be a slice at any position in the Z direction.

The magnetic resonance imaging system 100 uses the formed B0 field to transmit a static magnetic pulse signal to the object 16 located in the scanning chamber, so that protons in a resonant volumes in the body of the object 16 precess in an ordered manner to generate a longitudinal magnetization vector Mz.

The radio-frequency generator 113 is configured to generate a radio-frequency pulse, for example, a radio-frequency excitation pulse, in response to a control signal of the controller 120. The radio-frequency excitation pulse may have different flip angles due to different scan sequences. For example, in an FSE sequence, the flip angle of the radio-frequency excitation pulse is 90 degrees. The radio-frequency excitation pulse is amplified (for example, by a radio-frequency power amplifier (not shown)) and then applied to the radio-frequency transmitting coil 114, so that the radio-frequency transmitting coil 114 transmits to the object 16 a radio-frequency field B1 orthogonal to the B0 field to excite nuclei in the aforementioned resonant volume and generate a transverse magnetization vector Mxy.

The radio-frequency transmitting coil 114 may include, for example, a body coil disposed along an inner circumference of the main magnet, or a head coil dedicated to head imaging.

After the radio-frequency excitation pulse ends, the proton group becomes out-of-phase, the macroscopic transverse magnetization vector in the tissue gradually decays, a free induction decay signal, namely, a magnetic resonance signal that can be acquired, is generated during the process in which the transverse magnetization vector of the object 16 is gradually restored to zero. The magnetic resonance signal may be acquired in the form of "echoes," for example, spin echoes or gradient echoes, and which echo acquisition method is used may affect indicators such as the scanning time, imaging quality, etc.

Spin echoes typically use a radio-frequency refocusing pulse to refocus the phases of the proton group, and gradually increase the transverse magnetization vector, so that echoes can be acquired after the radio-frequency refocusing pulse ends. Scan sequences adopting the spin echo mode include, but are not limited to, SE, FSE, SSFSE, etc. Within one repetition time, the SE sequence applies one radio-frequency refocusing pulse after a radio-frequency transmit pulse, and acquires one echo, and each acquired echo is populated to one phase encoding line of a K-space in a sequential manner. Within one repetition time, the FSE sequence applies a plurality of radio-frequency refocusing pulses after a radio-frequency transmit pulse, and acquires a plurality of echoes, and the plurality of echoes are populated to a plurality of phase encoding lines of the K-space.

The gradient coil driver 115 is configured to provide a suitable current/power to the gradient coil assembly 116 in response to a gradient pulse control signal or a shimming control signal sent by the controller 120.

The gradient coil assembly 116, on one hand, forms a varying magnetic field in an imaging space so as to provide three-dimensional position information for the aforementioned magnetic resonance signal, and on the other hand generates a compensating magnetic field of the B0 field to shim the B0 field.

The gradient coil assembly 116 may include three gradient coils. The three gradient coils are respectively configured to generate magnetic field gradients inclined to three spatial axes (for example, the X-axis, Y-axis, and Z-axis) perpendicular to each other. More specifically, the gradient coil assembly 116 applies a magnetic field gradient in a slice selection direction (Z direction) so as to select a layer in the imaging volume. Those skilled in the art understand that the layer is any one of a plurality of two-dimensional slices distributed in the Z direction in the three-dimensional imaging volume. When scanning is performed for the imaging, the radio-frequency transmitting coil 114 transmits a radio-frequency excitation pulse to the layer of the imaging volume and excites the layer. The gradient coil assembly 116 applies a magnetic field gradient in a phase encoding direction (Y direction) so as to perform phase encoding on a magnetic resonance signal of the excited layer. The gradient coil assembly 116 applies a gradient field in a frequency encoding direction of the object 16 so as to perform frequency encoding on the magnetic resonance signal of the excited layer.

The aforementioned body coil may be connected to a transmitting/receiving (T/R) switch (not shown). The transmitting/receiving switch is controlled so that the body coil can be switched between a transmitting mode and a receiving mode. In the receiving mode, the body coil may be configured to receive a magnetic resonance signal from the object 16.

The surface coil 118 is usually arranged close to a scan part (region of interest) of the object 16 (for example, covering or laying on the body surface of the object 16), and the surface coil 118 is also configured to receive a magnetic resonance signal from the object 16.

The data acquisition unit 117 is configured to acquire the magnetic resonance signal (for example, received by the body coil or a surface coil) in response to a data acquisition control signal of the controller 120. In an embodiment, the data acquisition unit 117 may include, for example, a radio-frequency preamplifier, a phase detector, and an analog/digital converter, where the radio-frequency preamplifier is configured to amplify the magnetic resonance signal, the phase detector is configured to perform phase detection on the amplified magnetic resonance signal, and the analog/digital converter is configured to convert the phase-detected magnetic resonance signal from an analog signal to a digital signal.

The data acquisition unit 117 is further configured to store the digitized magnetic resonance signal (or echo) in the K-space in response to a data storage control signal of the controller 120. The K-space is a space to which raw data of magnetic resonance signals carrying spatial orientation encoding information is populated. Specifically, the data acquisition unit 117 populates, in response to a data storage control signal of the controller 120, the digitized magnetic resonance signals to the K-space in a specific manner.

The magnetic resonance imaging system 100 may include an image reconstruction unit 130, which is configured to perform an inverse Fourier transform on data stored in the K-space to reconstruct a three-dimensional image or a series of two-dimensional slice images of the imaging volume of the object 16. Specifically, the image reconstruction unit 130 may perform the image reconstruction described above based on communication with the controller 120.

The magnetic resonance imaging system 100 may include a processing unit 140, which may perform any required image post-processing on the aforementioned three-dimensional image or any image in an image sequence. The post-processing may be an improvement or adaptive adjustment made to an image in any of contrast, uniformity, sharpness, brightness, etc. Specifically, the processing unit 140 may perform the image processing method according to the embodiments of the present invention on the basis of communication with the controller 120.

In one embodiment, the controller 120, the image reconstruction unit 130, and the processing unit 140 may separately or collectively include a computer and a storage medium. The storage medium records a predetermined data processing program to be executed by the computer. For example, the storage medium may store a program used to implement imaging scanning, image reconstruction, image processing, etc. For example, the storage medium may store a program used to implement the magnetic resonance image processing method according to the embodiments of the present invention. The storage medium may include, for example, a ROM, a floppy disk, a hard disk, an optical disk, a magneto-optical disk, a CD-ROM, or a non-volatile memory card.

The magnetic resonance imaging system 100 may include a display unit 150, which may be configured to display an operation interface and various data, images or parameters generated during a data acquisition or processing process.

The magnetic resonance imaging system 100 includes a console 160, which may include user input devices, such as a keyboard, a mouse, etc. The controller 120 may communicate with the scanner 110, the image reconstruction unit, the image processing unit 140, the display unit 150, etc., in response to a control command generated by a user based on operating the console 160 or an operation panel/button, etc., disposed on a housing of a main magnet.

Based on the above description, the controller unit 120 is configured to control the various components/modules/units of the scanner 110 and the image reconstruction unit 130, the image processing unit 140, etc., to perform corresponding operations in a pre-scanning process, a formal scanning process, and image post-processing of magnetic resonance imaging. In one embodiment of the pre-scanning process, a magnetic resonance signal can be received by the body coil and the surface coil to reconstruct a body coil image and a surface coil image respectively, and a parameter for the formal scanning can be set on the basis of the body coil image and/or the surface coil image. In the formal scanning process, a magnetic resonance image of the scan part of the object 16 is acquired on the basis of the set scanning parameter. In the post-processing, a magnetic resonance image (to be corrected) is further processed on the basis of a clinical diagnosis requirement.

In the research of the present invention, it is found that the uniformity of the aforementioned magnetic resonance image S to be corrected is affected by a transmitting field pattern of the transmitting coil, a receiving field pattern of the transmitting coil, and a receiving field pattern of the surface coil, and the uniformity can be corrected on the basis of the following equation (1):

$$S1 = S * \frac{S_{body}}{S_{surf}} = [I * f_{psd}(B1_B^+) * B1_S^-] \left[\frac{B1_B^-}{B1_S^-}\right] = I * f_{psd}(B1_B^+) * B1_B^- \quad (1)$$

In equation (1), S1 is a first corrected image, S is the original image, for example, an image reconstructed on the basis of original image data, $S_{body}$ is the body coil image, and $S_{surf}$ is the surface coil image. I is an ideal image (or real image), $$B1_S^-$$

is the radio-frequency receiving field pattern of the surface coil, and $$B1_B^-$$

is the radio-frequency receiving field pattern of the body coil. The psd (pulse sequence design) is a scan sequence used when the original image S is generated, which includes a plurality of scanning parameters, and changes in the plurality of scanning parameters will change the uniformity of the radio-frequency transmitting field of the body coil $$B1_B^+$$

is the radio-frequency transmitting field pattern of the body coil. Since the pattern may change with the change of the scan sequence, the radio-frequency transmitting field pattern of the body coil may further be described as $$f_{psd}(B1_B^+),$$

which may be considered to be a functional relationship with $$B1_B^+$$

as a variable, and the functional relationship will change with the change of the psd.

It can be known from equation (1) that after eliminating the influence of the radio-frequency receiving field pattern of the surface coil, the image quality is also affected by the radio-frequency transmitting field pattern $$B1_B^+$$

of the body coil of the body coil and the radio-frequency receiving field pattern $$B1_B^-$$

of the body coil.

In order to further improve the image quality, for example, to increase the uniformity of the image, the first image S1 may be further processed on the basis of a radio-frequency field pattern of the body coil. The aforementioned radio-frequency field pattern of the body coil may be obtained by performing offline simulation of the body coil and pre-stored in the magnetic resonance imaging system, and the radio-frequency receiving field pattern of the body coil is the same as the radio-frequency field pattern of the body coil acquired offline. Therefore, the magnetic resonance image S may be processed on the basis of the following equation (2) to further eliminate image quality problems caused by the non-uniformity of the radio-frequency receiving field of the body coil.

$$S2 = S * \left[\frac{S_{body}}{S_{surf}} * \frac{1}{B1_B^-}\right] = [I * f_{psd}(B1_B^+) * B1_S^-]\left[\frac{B1_B^-}{B1_S^-} * \frac{1}{B1_B^-}\right] = I * f_{psd}(B1_B^+) \quad (2)$$

In equation (2), S2 is a second corrected image, $$B1_B^-$$

is the radio-frequency receiving field pattern of the body coil, which is the same as the radio-frequency field pattern of the body coil obtained above. Therefore, by dividing the image S to be processed or the first image S1 by the radio-frequency field pattern of the body coil, image problems caused by the non-uniformity of the radio-frequency receiving field of the transmitting coil can be eliminated or further eliminated.

Since the radio-frequency transmitting field of the body coil will be affected by the scan sequence used, and the sensitivity thereof will be affected by an imaged tissue parameter (for example, longitudinal relaxation time T1 and transverse relaxation time T2), if image quality problems caused by non-uniformity of the radio-frequency transmitting field of the body coil are to be eliminated, considerable parameter estimation and calculation are required, or more resources need to be consumed to redesign the radio-frequency pulse and the gradient pulse of the scan sequence, all of which will increase the difficulty and complexity of image correction.

Figure 2:
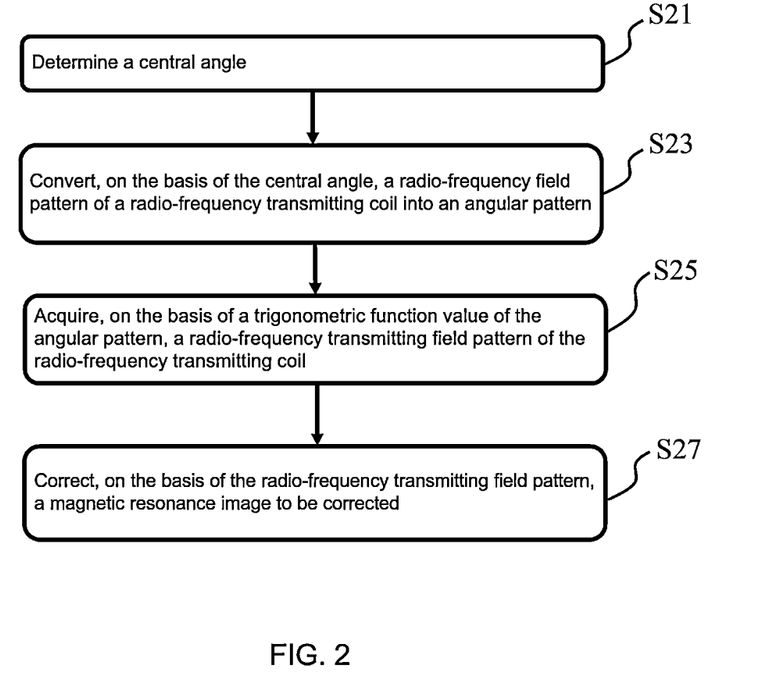
FIG. 2 is a flowchart of a magnetic resonance image processing method provided by one embodiment of the present invention.

Referring to FIG. 2, a flowchart of a magnetic resonance imaging processing method provided by one embodiment of the present invention is shown. As shown in FIG. 1, the method includes steps S21, S23, S25, and S27.

In step S21, a central angle is determined. The central angle may be determined on the basis of a flip angle of a radio-frequency transmitting pulse in a scan sequence. The scan sequence is a scan sequence selected when a magnetic resonance image to be processed is generated.

In one embodiment, the central angle is equal to the flip angle of the radio-frequency transmitting pulse in the scan sequence. For example, if the magnetic resonance image is obtained by executing an FSE sequence, and the flip angle is set to 90 degrees when the sequence is executed, then the central angle is determined to be 90 degrees.

In step S23, a radio-frequency field pattern of a transmitting coil (for example, a body coil) is converted into an angular pattern θ on the basis of the central angle. As described above, the radio-frequency field pattern of the transmitting coil may be obtained by offline simulation of the transmitting coil and pre-stored in a magnetic resonance imaging system. The radio-frequency field pattern usually represents an intensity distribution of a radio-frequency field. For example, the value of a pixel in the center of the radio-frequency field pattern may be 1, and the value in an edge portion may be less than 1.

In the research of the present invention, it is found that the influence of a radio-frequency transmitting field of the transmitting coil on an image signal is usually in a trigonometric function relationship (regardless of what form of scan sequence or sequence parameter is used). Therefore, after the radio-frequency field pattern of the transmitting coil is converted into an angle in step S23, in step S25, a radio-frequency transmitting field pattern $$f_{psd}(B1_B^+)'$$

of the transmitting coil may be acquired on the basis of a trigonometric function value of the angular pattern θ. The trigonometric function may be any form of trigonometric function, for example, a sine function, a cosine function, a tangent function, a cotangent function, a secant function, a cosecant function, etc.

In step S27, a magnetic resonance image to be corrected is corrected on the basis of the radio-frequency transmitting field pattern $$f_{psd}(B1_B^+)'.$$

For example, the magnetic resonance image to be corrected (for example, image S, S1, S2, or an image obtained after other image processing) may be divided by the aforementioned radio-frequency transmitting field pattern $$f_{psd}(B1_B^+)'$$

of the body coil to obtain a corrected image, i.e., a third corrected image S3.

For example, when the magnetic resonance image to be corrected is the second image S2, the magnetic resonance image to be corrected is further divided by the radio-frequency transmitting field pattern $$f_{psd}(B1_B^+)'$$

of the body coil according to the following equation (3), to obtain the third corrected image S3.

$$S3 = I * f_{psd}(B1_B^+) * \frac{1}{f_{psd}(B1_B^+)'} \cong I \quad (3)$$

Figure 3:
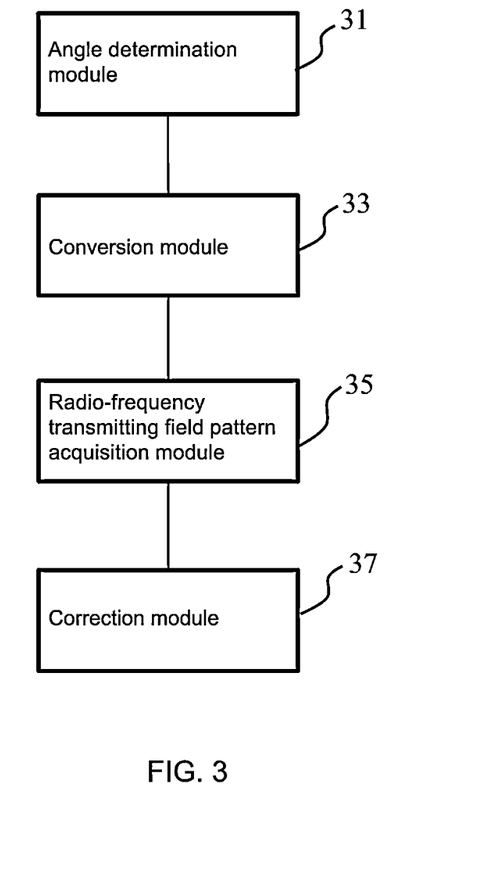
FIG. 3 is a block diagram of a magnetic resonance image processing device provided by one embodiment of the present invention.

Referring to FIG. 3, a flowchart of a magnetic resonance imaging method according to another embodiment of the present invention is shown. As shown in FIG. 3, the method further includes an adjustment step. In the adjustment step, a weight parameter is determined, and a trigonometric function value of an angular pattern is adjusted on the basis of the weight parameter. Therefore, in step S25, specifically, a radio-frequency transmitting field pattern $$f_{psd}(B1_B^+)'$$

is acquired on the basis of the adjusted trigonometric function value.

The aforementioned weight parameter may be an empirical value, and the empirical value may be implanted into a magnetic resonance imaging system after verification in various aspects, for use as an optional parameter for image processing.

More specifically, the radio-frequency transmitting field pattern $f_{psd}(B1_B^+)'$ may be acquired on the basis of equation (4).

$$f_{psd}(B1_B^+)' = \sum C_n (f(\theta))^n \quad (4)$$

Therefore, the above equation (3) may be expressed as:

$$S3 = I * f_{psd}(B1_B^+) * \frac{1}{\sum C_n (f(\theta))^n} \quad (5)$$

In one embodiment, equation (4) may be expanded into the following form:

$$f_{psd}(B1_B^+)' = C_1 * f(\theta) + C_2 * f((\theta))^2 + \ldots C_n * f((\theta))^n \quad (6)$$

In formulas (4)-(6), $C_n$ is the weight parameter, and $C_n$ is greater than 0, which may be any value between 0 and 1, or may be a value greater than or equal to 1. n is the counts of adjusting the trigonometric function value on the basis of the weight parameter, n is greater than 0, n and m may be integers, or may be decimals, for example, n may be 1, 2, or a number between 0 and 2. θ is an angle value in the angular pattern. f(θ) is a trigonometric function value with θ as an independent variable, and f(θ) may be a sine function.

n may also be an empirical value, and the empirical value may be implanted into a magnetic resonance imaging system after verification in various aspects, for use as an optional parameter for image processing.

Therefore, step S25 may include receiving the value of the weight parameter $C_n$ selected on the basis of a user operation, and may also include receiving the value of the count n of adjustments selected based on the user operation. When the value of the weight parameter $C_n$ or the count n of adjustments is unique, the value may also be directly called to adjust the trigonometric function value.

In other embodiments, $C_n$ and n may also be a default value 1, and therefore there is no need to select a parameter, and there is also no need to adjust the aforementioned trigonometric function value.

In other embodiments, when the image to be corrected is S (original image) or S1 (image corrected based on a radio-frequency field pattern of a surface coil), after step S27, the following steps may further be included:

The corrected image obtained after step S27 is further divided by the radio-frequency field pattern $B1_B^-$ of the radio-frequency transmitting coil, so as to obtain a further corrected image. Therefore, by performing the above steps S21, S23, S25, and step S27 to eliminate image problems caused by a radio-frequency transmitting field of the radio-frequency transmitting coil, and further eliminate image problems caused by a radio-frequency receiving field of the radio-frequency transmitting coil.

In other embodiments, the image to be corrected in step S27 may be an image obtained after image correction is performed on the basis of the radio-frequency field pattern of the radio-frequency transmitting coil. Therefore, the image quality problems caused by the radio-frequency receiving field of the radio-frequency transmitting coil in the image are eliminated first, and then step S27 is performed to eliminate the image quality problems caused by the radio-frequency transmitting field of the radio-frequency transmitting coil.

In addition, the image correction based on the radio-frequency field of the surface coil may be performed before, after, or between the image correction based on the radio-frequency receiving field of the radio-frequency transmitting coil and the image correction based on the radio-frequency transmitting field of the radio-frequency transmitting coil.

On the basis of the description above, further provided in an embodiment of the present invention can be a computer-readable storage medium, including a stored computer program, wherein the magnetic resonance image processing method in any of the aforementioned embodiments is performed when the computer program is run.

Further provided in another embodiment of the present invention can be a magnetic resonance image processing device, which may be used to process an image that has been reconstructed or processed via a magnetic resonance imaging system. The device may be a part of an image processing unit of the magnetic resonance imaging system, or may be independent of the magnetic resonance imaging system and capable of communicating with the magnetic resonance imaging system.

Referring to FIG. 3, a block diagram of one embodiment of the magnetic resonance image processing device is shown. As shown in FIG. 3, the device includes an angle determination module 31, a conversion module 33, a radio-frequency transmitting field pattern acquisition module 35, and a correction module 37. The angle determination module 31 is configured to determine a central angle. The conversion module 33 is configured to convert, on the basis of the central angle, a radio-frequency field pattern of a radio-frequency transmitting coil into an angular pattern. The radio-frequency transmitting field pattern acquisition module 35 is configured to acquire, on the basis of a trigonometric function value of the angular pattern, a radio-frequency transmitting field pattern of the radio-frequency transmitting coil. The correction module 37 is configured to correct, on the basis of the radio-frequency transmitting field pattern, a magnetic resonance image.

In one embodiment, the radio-frequency transmitting field pattern acquisition module 35 is further configured to determine a weight parameter, adjust the trigonometric function value of the angular pattern on the basis of the weight parameter, and acquire the radio-frequency transmitting field pattern on the basis of the adjusted trigonometric function value.

Specifically, the radio-frequency transmitting field pattern acquisition module 35 uses equation (4) to acquire the radio-frequency transmitting field pattern.

The magnetic resonance image processing device may be configured to implement the magnetic resonance image processing method of any of the above embodiments.

The magnetic resonance image processing method and device in the embodiments of the present invention convert a radio-frequency field pattern of a radio-frequency transmitting coil into an angular pattern, acquire a radio-frequency transmitting field pattern of the radio-frequency transmitting coil on the basis of a trigonometric function value of the angular pattern, and perform image correction on a magnetic resonance image on the basis of the radio-frequency transmitting field pattern, thereby eliminating shadowing and other image non-uniformity problems caused by non-uniformity of a radio-frequency transmitting field. Moreover, the embodiments of the present invention avoid the problem of difficulty in acquiring the radio-frequency transmitting field pattern of the radio-frequency transmitting coil caused by redesigning a scan sequence or complex parameter (for example, imaged tissue parameters T1 and T2, and other parameters related to the scan sequence) estimation, calculation, or model construction.

Figure 4:
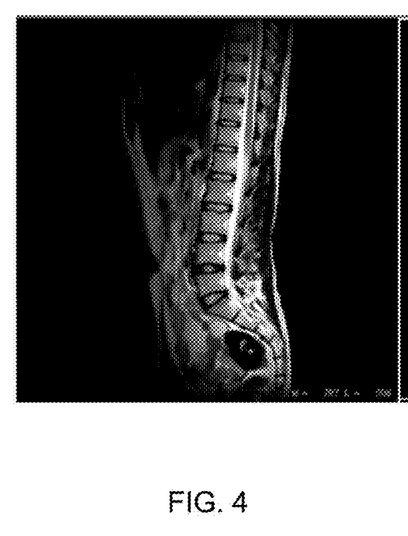
FIG. 4 is a result of processing a magnetic resonance image to be corrected by the prior art.
Figure 5:
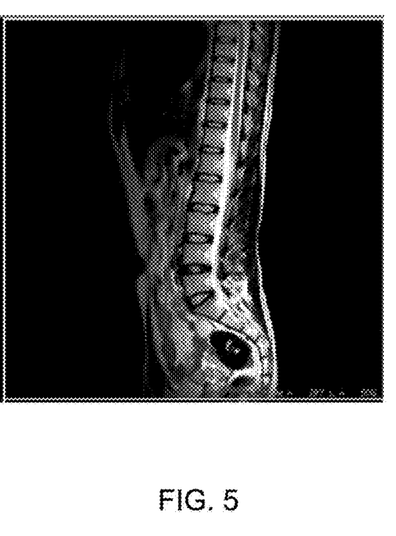
FIG. 5 is a result of processing a magnetic resonance image to be corrected by an embodiment of the present invention.

Referring to FIG. 4, a result of processing a magnetic resonance image to be corrected based on the prior art is shown, and referring to FIG. 5, a result of processing a magnetic resonance image to be corrected using an embodiment of the present invention is shown. By comparing FIG. 4 and FIG. 5, it can be seen that the image in FIG. 5 is more uniform than the image in FIG. 4, and some shadows in FIG. 4 do not appear in FIG. 5.

Some exemplary embodiments have been described above. However, it should be understood that various modifications can be made. For example, if the described techniques are performed in a different order and/or if the components of the described system, architecture, device, or circuit are combined in other manners and/or replaced or supplemented with additional components or equivalents thereof, a suitable result can be achieved. Accordingly, other implementations also fall within the protection scope of the claims.

The invention claimed is:

1. A magnetic resonance image processing method, comprising:
    determining a central angle;
    converting, on the basis of the central angle, a radio-frequency field pattern $$B1_B^-$$

of a radio-frequency transmitting coil into an angular pattern (θ), wherein the radio-frequency field pattern of the radio-frequency transmitting coil is obtained by performing an offline simulation of the radio-frequency transmitting coil, wherein the radio-frequency field pattern represents an intensity distribution of a radio-frequency field;
    acquiring, on the basis of a trigonometric function value of the angular pattern, a radio-frequency transmitting field pattern $$f_{psd}(B1_B^+)'$$

of the radio-frequency transmitting coil;
    dividing a magnetic resonance image by the radio-frequency transmitting field pattern of the radio-frequency transmitting coil to generate a corrected magnetic resonance image;
    dividing the corrected magnetic resonance image by the radio-frequency field pattern of the radio-frequency transmitting coil to obtain a further corrected image;
    the method further comprising: determining at least one weight parameter, and adjusting, on the basis of the at least one weight parameter, the trigonometric function value of the angular pattern, wherein the radio-frequency transmitting field pattern is acquired on the basis of the adjusted trigonometric function value; and
    wherein the radio-frequency transmitting field pattern is acquired on the basis of an equation $$f_{psd}(B1_B^+)' = C_1 * f(\theta) + C_2 * f((\theta))^2 + \ldots C_n * f((\theta))^n,$$

where $$f_{psd}(B1_B^+)'$$

is the radio-frequency transmitting field pattern, $C_1$ is a first weight parameter, $C_2$ is a second weight parameter, $C_n$ is a $n^{th}$ weight parameter, n is the counts of adjusting the trigonometric function value, θ is an angle value in the angular pattern, and f(θ) is a trigonometric function with θ as an independent variable.

2. The method according to claim 1, wherein the trigonometric function value of the angular pattern comprises a sine function value of the angular pattern.

3. The method according to claim 1, wherein the central angle is determined on the basis of a flip angle of a radio-frequency transmitting pulse of a scan sequence that generates the magnetic resonance image.

4. The method according to claim 1, wherein the central angle is 90 degrees.

5. A non-transitory computer-readable storage medium, comprising a stored computer program, wherein the method according to claim 1 is performed when the computer program is run.

6. A magnetic resonance image processing device, comprising:
    an angle determination module, configured to determine a central angle;
    a conversion module, configured to convert, on the basis of the central angle, a radio-frequency field pattern $$B1_B^-$$

of a radio-frequency transmitting coil into an angular pattern (θ), wherein the radio-frequency field pattern of the radio-frequency transmitting coil is obtained by performing an offline simulation of the radio-frequency transmitting coil, wherein the radio-frequency field pattern represents an intensity distribution of a radio-frequency field;

a radio-frequency transmitting field pattern acquisition module, configured to acquire, on the basis of a trigonometric function value of the angular pattern, a radio-frequency transmitting field pattern $$f_{psd}(B1_B^+)'$$

of the radio-frequency transmitting coil; and a correction module, configured to divide a magnetic resonance image by the radio-frequency transmitting field pattern of the radio-frequency transmitting coil to generate a corrected magnetic resonance image; and divide the corrected magnetic resonance image by the radio-frequency field pattern of the radio-frequency transmitting coil to obtain a further corrected image;

wherein the radio-frequency transmitting field pattern acquisition module is configured to determine at least one weight parameter, and adjust the trigonometric function value of the angular pattern on the basis of the at least one weight parameter; and acquire, on the basis of the adjusted trigonometric function value, the radio-frequency transmitting field pattern; and, wherein the radio-frequency transmitting field pattern acquisition module is configured to acquire the radio-frequency transmitting field pattern on the basis of a formula $$f_{psd}(B1_B^+)' = C_1 * f(\theta) + C_2 * f((\theta))^2 + \ldots C_n * f((\theta))^n, \text{ where } f_{psd}(B1_B^+)'$$

is the radio-frequency transmitting field pattern, $C_1$ is a first weight parameter, $C_2$ is a second weight parameter, $C_n$ is a $n^{th}$ weight parameter, n is the counts of adjusting the trigonometric function value, $\theta$ is an angle value in the angular pattern, and $f(\theta)$ is a trigonometric function with $\theta$ as an independent variable.

\* \* \* \* \*